US006774381B2

(12) United States Patent
Kawada et al.

(10) Patent No.: US 6,774,381 B2
(45) Date of Patent: Aug. 10, 2004

(54) ELECTRON BEAM SYSTEM FOR TREATING FILAMENTARY WORKPIECE, AND METHOD OF FABRICATING OPTICAL FIBERS

(75) Inventors: Nobuo Kawada, Annaka (JP); Toshio Ohba, Annaka (JP)

(73) Assignee: Shin-Etsu Chemical Co., LTD, Chiyoda-ku (JP)

(*) Notice: Subject to any disclaimer, the term of this patent is extended or adjusted under 35 U.S.C. 154(b) by 0 days.

(21) Appl. No.: 09/908,808

(22) Filed: Jul. 20, 2001

(65) Prior Publication Data

US 2002/0008213 A1 Jan. 24, 2002

(30) Foreign Application Priority Data

Jul. 21, 2000 (JP) ........................................ 2000-220503

(51) Int. Cl.[7] .............................. A61N 5/00; G21N 5/00; G21N 21/00
(52) U.S. Cl. ................................ 250/492.3; 250/453.11
(58) Field of Search ......................... 250/492.3, 453.11, 250/455.11

(56) References Cited

U.S. PATENT DOCUMENTS

| 2,989,633 A | * | 6/1961 | Wilson ................... 250/453.11 |
| 5,083,033 A | * | 1/1992 | Komano et al. .......... 250/492.2 |
| 6,365,903 B2 | * | 4/2002 | Krijn ........................... 250/396 |
| 2002/0036264 A1 | * | 3/2002 | Nakasuji et al. ............. 250/306 |

FOREIGN PATENT DOCUMENTS

| JP | B2119694 | 4/1989 | ............ C09D/3/48 |
| JP | B2550454 | 7/1993 | ............ C03C/25/02 |
| JP | B22522663 | 5/1996 | ......... C08F/290/00 |
| JP | B22547021 | 8/1996 | ......... C08F/290/06 |

* cited by examiner

Primary Examiner—Stephen D. Meier
Assistant Examiner—Alfred Dudding
(74) Attorney, Agent, or Firm—Birch, Stewart, Kolasch & Birch, LLP

(57) ABSTRACT

An electron beam system for treating filamentary workpieces includes an electron beam irradiation chamber having openings through which passes a filamentary workpiece, an electron beam generator including means for generating, accelerating and focusing electrons, and a communicating section which connects the electron beam generator with the electron beam irradiation chamber. The system also has a differential evacuating means for holding the pressure within the electron beam generator below that within the electron beam irradiation chamber. Electrons are generated, accelerated, and focused by the electron beam generator into a beam which passes from the generator through the communicating section to the electron beam irradiation chamber where the beam is directed at a filamentary workpiece. The system is able to uniformly, efficiently, and continuously apply electron beam irradiation to a traveling filamentary workpiece. When used in the fabrication of optical fiber, this system can accommodate higher fiber drawing speeds without compromising the transmission characteristics of the resulting optical fiber.

9 Claims, 2 Drawing Sheets

ELECTRON BEAM SYSTEM FOR TREATING FILAMENTARY WORKPIECE, AND METHOD OF FABRICATING OPTICAL FIBERS

BACKGROUND OF THE INVENTION

1. Field of the Invention

The present invention relates to an apparatus which continuously applies an electron beam to a filamentary workpiece, and more particularly to an electron beam apparatus for curing a coating material that has been applied to optical fiber. The invention relates also to a method of fabricating optical fiber using such an apparatus.

"Filamentary workpiece," as used herein, includes slender, continuous workpieces with a circular cross-sectional shape having a diameter of up to 5 mm, and preferably up to 1 mm; as well as slender, continuous workpieces with an elliptical or rectangular cross-sectional shape in which the long axis or horizontal dimension is up to 10 mm, and preferably up to 4 mm, and the short axis or vertical dimension is up to 3 mm, and preferably up to 1 mm.

2. Prior Art

As an electron beam passes through matter, it excites orbital electrons in the matter, triggering chemical reactions and generating secondary electrons and x-rays. Gradually, the electron beam loses energy to the matter and slows down. It also undergoes scattering, causing the radiation to advance in different directions and disperse. This tendency is especially striking in high-density matter such as solids. Electron beams endowed with such characteristics have been used in many diverse industrial applications. Applications in manufacturing industries in particular fall into two broad categories: those involving the use of chemical reactions triggered by electron beams, and those involving the use of heat generated with the loss of kinetic energy by the electrons. Examples of the former type of application include resin crosslinking reactions such as in tire rubber and polyethylene coatings on electrical wire, as well as resin curing reactions in coated paper and printing inks. Examples of the latter type of application include electron-beam melting in smelting operations and electron-beam welding in metalworking operations.

In the first type of application mentioned above, part of the energy of the irradiated electrons is consumed in the chemical reactions. Most of the remaining energy simply passes through, although a portion thereof becomes heat. Such heat is minimized to avoid the deteriorating effect it can have on the resin. By contrast, in the second type of application, substantially all of the kinetic energy of the electron beam is converted to heat when the electrons slow down within the irradiated object, and is thus available for heating the metal to its melting temperature. Hence, the role played by electron beams differs completely from one type of application to another.

At the same time, the systems used in each case for irradiating electron beams share a common feature; each has an electron generating means and an electron accelerating means of some type. However, the electron beam systems used in the first type of application described above are designed to irradiate a broad surface area so as to increase productivity, whereas the electron beam systems used in the second type of application are designed for spot irradiation to increase energy density. Therefore, in connection with the former type of application, relatively low acceleration voltage equipment makes use of a "curtain" system having an electron generating means and an electron accelerating means that produce a broad electron beam band. Relatively high-acceleration voltage equipment makes use of a "scanning" system which has both an electron generating means and an electron accelerating means that together produce a narrow linear beam, and also an electron scanning means which distributes this beam over a broad area. In the latter type of application, the electron beam system typically includes an electron generating means and electron accelerating means that produce a linear beam, and also an electron focusing means that concentrates the beam toward a focal point.

In the first type of application, electron generation and acceleration are carried out in a vacuum, whereas irradiation is generally carried out at atmospheric pressure, which is more conducive to continuous treatment and thus advantageous in terms of productivity. In this type of system, a thin metal foil generally serves as the boundary separating atmospheric pressure from the vacuum, the electron beam being made to pass from the vacuum out to atmospheric pressure through the metal foil. The electron beam is strongly scattered as it passes through the metal foil, and thus diffuses following passage through the foil. However, this has not been a problem because the beam is intended to irradiate a broad area.

On the other hand, in the second type of application, because the electron beam must focus at one point, irradiation is generally carried out in a vacuum in which scattering does not occur. Most equipment of this type uses a batch treatment-type high-vacuum system in which the object to be irradiated is placed in an irradiation chamber and irradiation is carried out following evacuation of the chamber to a high vacuum. However, in a high-vacuum system, evacuation takes a long time, resulting in poor productivity. Hence, low-vacuum systems have been developed and adapted for practical use in which the irradiation chamber is connected to the high-vacuum electron-beam generator by a differential evacuating means, thereby making it possible to carry out irradiation even when the degree of vacuum in the irradiation chamber is low; i.e., even at a short evacuation time.

JP-B 5-50454 discloses art relating to the electron beam irradiation of a filamentary workpiece. While this prior-art reference does not specify the type of apparatus used, the energy of the electron beam or the degree of irradiation, it does describe the electron-beam curing of an optical fiber coating material. However, no technology has previously been arrived at for the continuous application of a focused electron beam to a filamentary workpiece under atmospheric pressure.

A variety of optical fibers are made, including quartz glass fibers, multicomponent glass fibers, and plastic fibers. Of these, large quantities of quartz glass optical fibers are used in a broad range of applications on account of favorable characteristics such as their light weight, low loss, high durability and large transmission capacity. However, the most common quartz glass optical fibers have a diameter of only 125 $\mu$m and thus have a tendency to break with even the slightest scratch. Also, because transmission loss increases when the fiber is subjected to an external stress such as bending, a resin coating composed of a soft primary coating layer and a hard secondary coating layer surrounding the first layer is applied. Coating is typically carried out by using a die-coating process to apply a liquid resin over the bare optical fiber immediately after the fiber has been melt-drawn, then curing the resin by the application of heat or exposure to radiation (generally ultraviolet light). Secondary coating may be carried out by a coating and curing process conducted either subsequent to or concurrent with coating and curing of the primary coating. The coated optical fiber is also commonly colored with an ink for the sake of identification. A number of coated optical fibers, typically four or eight, are gathered into a bundle, which is coated with a liquid resin. The resin is then cured by the application of heat or by exposure to radiation such as ultraviolet light, thereby giving an optical fiber tape.

Coating materials proposed for such use include urethane acrylate-based ultraviolet-curable resin compositions. JP-B 1-19694, JP No. 2522663 and JP No. 2547021 disclose liquid compositions of UV-curable resins composed of a urethane acrylate oligomer, a reactive diluent and a photo-polymerization initiator.

Optical fibers are being drawn today at higher speeds to enhance the productivity of the manufacturing process. This rise in speed has been accompanied by an increase in the energy per unit time required to cure the resin coating. But because improvements in the output of UV lamps commonly used for curing the resin have been unable to keep pace with such progress, it has been necessary to install multiple UV irradiation units in series. Unfortunately, the rate of production achievable is often effectively capped by the amount of space available for such installation.

Electron beam curing is generally regarded as more energy efficient than UV curing. Yet, this is true only in those cases where the irradiated object is broad and the electron beam, even if it diffuses, strikes some portion of the irradiated object, such as in the resin curing of coated paper or printing ink. When a prior-art curtain-type electron beam system is used to irradiate a filamentary workpiece with an electron beam, even if the direction of the electron beam band is aligned with the direction of the filamentary workpiece, the large degree of scattering by the electron beam as it passes through the metal foil results in a very small proportion of electrons striking the filamentary workpiece, and thus a low energy efficiency. When a scanning-type electron beam system is used, even if the beam is not scanned and is instead held stationary on the filamentary workpiece, considerable scattering of the electron beam as it passes through the metal foil likewise occurs, again resulting in a low efficiency. This problem has been overcome in the electron-beam crosslinking of polyethylene-coated electrical wire by having the wire double back repeatedly as it travels so as pass through the irradiation system a number of times. However, this approach is useless in optical fibers because, when an optical fiber that has been coated with a liquid composition is electron beam cured, such bending back and forth of the fiber before curing is complete damages the coating.

Electron beam scattering can be avoided by irradiation in a vacuum, but the vacuum-type irradiation systems used in welding are batch-type systems. Such systems are incapable of carrying out continuous treatment, and so cannot be used for curing optical fiber coating. Moreover, existing electron beam welding systems are unable to uniformly irradiate the periphery of a filamentary workpiece during travel.

Another problem with the electron beam curing of optical fiber coating is that the electron beams alter germanium dopant in the optical fiber core, increasing transmission loss.

SUMMARY OF THE INVENTION

It is therefore an object of the invention to provide an apparatus which is capable of uniformly, efficiently, and continuously applying electron beam irradiation to a traveling filamentary workpiece, and particularly an electron beam system for treating a filamentary workpiece which can accommodate higher fiber drawing speeds and does not compromise the transmission characteristics of the optical fiber. An additional object of the invention is to provide a method of fabricating optical fibers using such an apparatus.

Accordingly, in a first aspect, the invention provides an electron beam system for treating a filamentary workpiece, which system includes an electron beam irradiation chamber having a plurality of openings through which passes a filamentary workpiece, an electron beam generator having an electron generating means, an electron accelerating means and an electron focusing means, a communicating section which connects the electron beam generator with the electron beam irradiation chamber, and differential evacuating means of at least one stage for holding the pressure within the electron beam generator below that within the electron beam irradiation chamber. Electrons are generated by the electron generating means, accelerated by the electron accelerating means, and focused by the electron focusing means into a beam, which passes from the electron beam generator through the communicating section to the electron beam irradiation chamber where the beam is directed at a filamentary workpiece that passes continuously through the openings in the chamber.

The electron beam system preferably has a plurality of electron beam generators arranged at approximately equal intervals around the electron beam irradiation chamber.

It is also preferable for the electron beam system to have a purge gas feeding means which is situated on the communicating section at a position adjacent to the electron beam irradiation chamber and feeds purge gas so as to make the pressure within the communicating section in the vicinity of the purge gas feeding higher than the pressure within the electron beam irradiation chamber.

According to one embodiment of the electron beam system according to the invention, the pressure within the electron beam irradiation chamber is typically about atmospheric pressure.

According to another embodiment of the inventive system, the pressure within the electron beam irradiation chamber is kept below atmospheric pressure by another differential evacuating means mounted at an opening through which the filamentary workpiece passes.

In the above embodiment of the invention in which the interior of the electron beam irradiation chamber is typically at about atmospheric pressure, the electron beam system preferably has a means for placing the electron beam irradiation chamber under an inert gas atmosphere, and preferably a helium atmosphere. In a system in which the irradiation chamber is under an inert gas atmosphere, the distance from the inlet where the electron beam enters the irradiation chamber to the filamentary workpiece is preferably less than about 60 mm, and most preferably less than about 20 mm.

In the electron beam system according to the first aspect of the invention, it is preferable to dispose a means for reflecting or absorbing the electron beam in the electron beam irradiation chamber such as to face across the filamentary workpiece and toward the electron beam generator.

In the electron beam system of the invention, the filamentary workpiece is typically an optical fiber coated with a liquid composition of an electron beam-curable resin. Moreover, the accelerated electrons preferably have a maximum energy of up to about 120 keV and an average energy of at least about 60 keV.

In a second aspect, the invention provides a method of fabricating optical fiber, which method includes the step of applying a liquid composition of an electron beam-curable resin coating material to an optical fiber, followed by the step of using the electron beam system of the first aspect of the invention to irradiate the applied composition with an electron beam in which the accelerated electrons have a maximum energy of up to about 120 keV and an average energy of at least about 60 keV so as to cure the coating material.

According to one embodiment of the method of the invention, the electron beam is applied within a nitrogen atmosphere and the distance from the inlet where the electron beam enters the irradiation chamber to the optical fiber is less than about 20 mm.

According to another embodiment of the inventive method, the electron beam is applied within a helium atmosphere and the distance from the inlet where the electron beam enters the irradiation chamber to the optical fiber is less than about 60 mm.

In the optical fiber fabricating method of the invention, the electron beam-curable resin is typically composed primarily of urethane acrylate, and the electron beam is preferably irradiated in an atmosphere having an oxygen concentration of less than about 1,000 ppm and such as to give an absorbed dose of about 10 to about 100 kGy.

According to another embodiment of the electron beam system of the invention, the filamentary workpiece is a bundle of optical fibers that is coated with a liquid composition of an electron beam-curable resin. The accelerated electrons in this embodiment preferably have a maximum energy of up to about 160 keV and an average energy of at least about 120 keV.

In a third aspect, the invention provides a method of fabricating optical fiber tape, which method includes the step of applying a liquid composition of an electron beam-curable resin coating material to a bundle of optical fibers, followed by the step of using the electron beam system of the first aspect of the invention to irradiate the applied composition with an electron beam in which the accelerated electrons have a maximum energy of up to about 160 keV and an average energy of at least about 120 keV so as to cure the coating material.

According to one embodiment of the above optical fiber tape fabricating method, the electron beam is applied within a nitrogen atmosphere and the distance from the inlet where the electron beam enters the irradiation chamber to the bundle of optical fibers is less than about 20 mm.

In another embodiment, the electron beam is applied within a helium atmosphere and the distance from the inlet where the electron beam enters the irradiation chamber to the bundle of optical fibers is less than about 60 mm.

In the optical fiber tape fabricating method of the invention, the electron beam-curable resin is typically composed primarily of urethane acrylate, and the electron beam is preferably irradiated in an atmosphere having an oxygen concentration of less than about 1,000 ppm and such as to give an absorbed dose of about 10 to about 100 kGy.

DETAILED DESCRIPTION OF THE PREFERRED EMBODIMENTS

The objects, features and advantages of the invention will become more apparent from the following detailed description, taken in conjunction with the foregoing diagrams.

The electron beam system for treating a filamentary workpiece according to the present invention includes (1) an electron beam irradiation chamber having a plurality of openings through which passes a filamentary workpiece, (2) an electron beam generator having an electron generating means, an electron accelerating means and an electron focusing means, and (3) a communicating section which connects the electron beam generator with the electron beam irradiation chamber. In addition, the system also has a differential evacuating means of at least one stage for holding the pressure within the electron beam generator below that within the electron beam irradiation chamber. In the electron beam system of the invention, electrons which have been generated by the electron generating means, accelerated by the electron accelerating means, and focused by the electron focusing means then pass as a beam from the electron beam generator through the communicating section to the electron beam irradiation chamber, where the beam is directed at a filamentary workpiece that passes continuously through the openings in the chamber. This arrangement enables the system to continuously carry out the uniform and efficient electron beam irradiation of a filamentary workpiece.

Figure 1:
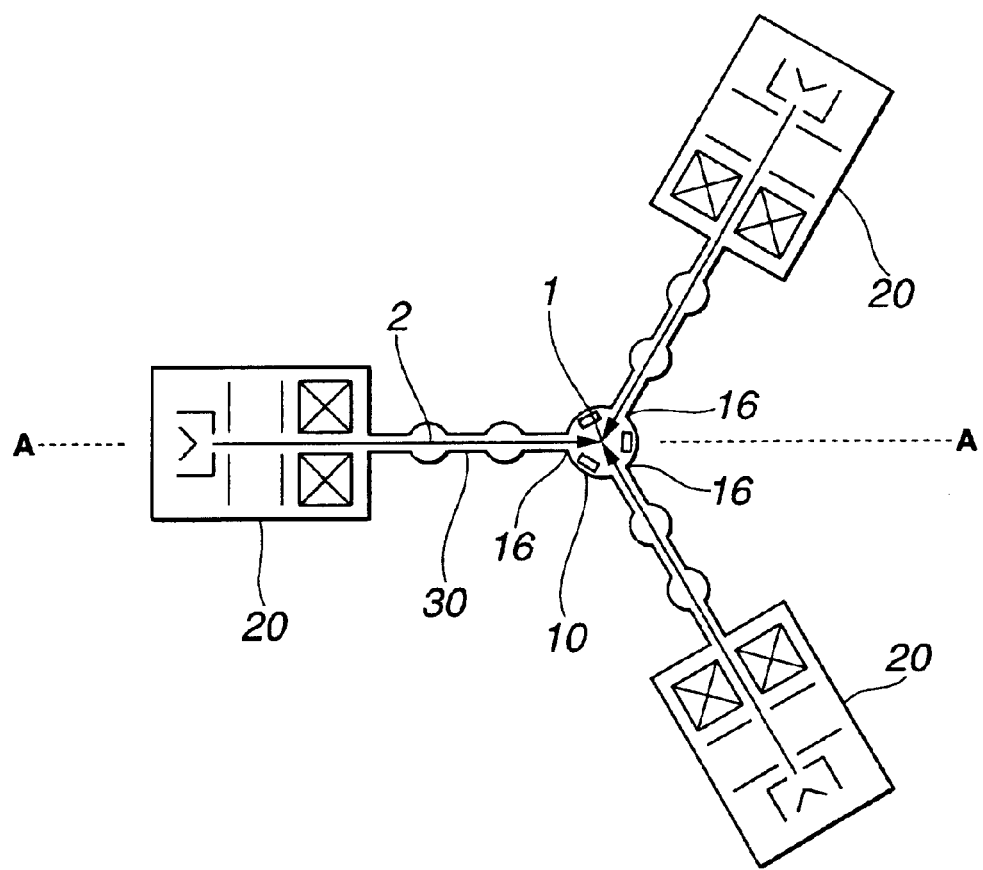
FIG. 1 is a cross-sectional view showing an electron beam system according to one embodiment of the present invention.
Figure 2:
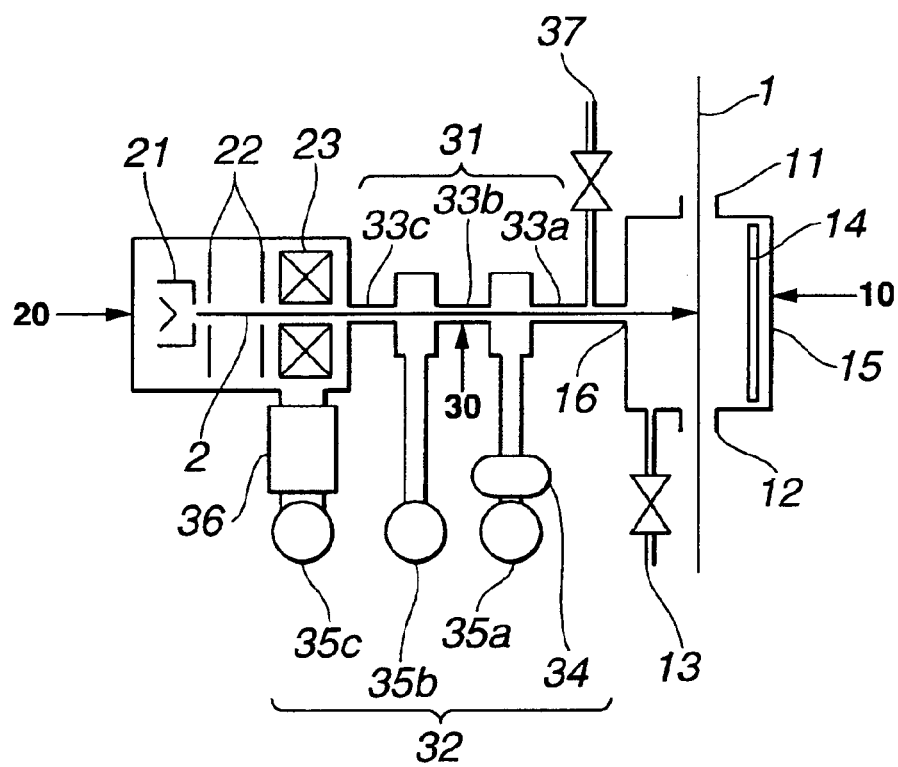
FIG. 2 is a sectional view of the same electron beam system along line A—A in FIG. 1.

Referring to FIGS. 1 and 2, which depict an electron beam system for treating a filamentary workpiece according to one embodiment of the invention, an electron beam irradiation chamber 10 in the form of a tube substantially closed at both ends is provided at the respective ends with openings 11 and 12 which serve as the inlet and outlet for a filamentary workpiece 1. The workpiece 1 enters the electron beam irradiation chamber 10 through one of the openings (inlet) 11, passes through the center of the chamber 10 during which time it is irradiated with an electron beam 2, then leaves the chamber through the other opening (outlet) 12. An inert gas line 13 is disposed on the outlet end of the electron beam irradiation chamber 10 as a means for placing the interior of the chamber 10 under an inert gas atmosphere. An inert gas such as helium or nitrogen is fed through the line 13 into the chamber 10 so as to enable electron beam irradiation of the filamentary workpiece 1 to be carried out within an inert gas atmosphere.

An electron beam generator 20 in the shape of a closed box has disposed at the interior therein an electron generating means 21 which generates electrons, an electron accelerating means 22 which accelerates the generated electrons, and an electron focusing means 23 which focuses the accelerated electrons. This arrangement generates an electron beam 2 and directs it at the electron beam irradiation chamber 10.

The electron beam system according to the invention may include one or more electron beam generator 20 of the type just described. In a system having a plurality of electron beam generators 20, it is advantageous for the generators 20 to be spaced apart at approximately equal intervals around the electron beam irradiation chamber 10. In the system shown in FIG. 1, three electron beam generators 20 are spaced apart at intervals of 120 degrees around a electron beam irradiation chamber 10 at the center.

The inventive electron beam system additionally includes a differential evacuating means 30 having both a communicating section 31 such as a small-bore tube or orifice which connects the electron beam irradiation chamber 10 and the electron beam generator 20, and having also a vacuum pump 32. One end of the communicating section 31 is airtightly coupled to the electron beam irradiation chamber 10 side and the other end is airtightly coupled to the electron beam generator 20 side. By means of this arrangement, the electron beam 2 generated by the electron beam generator 20 passes through the communicating section 31 and irradiates the filamentary workpiece traveling through the interior of the electron beam irradiation chamber 10. At the same time, evacuation by the vacuum pump 32 keeps the pressure within the electron beam generator 20 lower than the pressure within the electron beam irradiation chamber 10.

In the system shown in the accompanying diagrams, the differential evacuating means 30 is composed of three stages. From the electron beam irradiation chamber 10 side, the first stage is composed of a small-bore tube 33a, a mechanical booster pump 34, and an oil-sealed rotary vacuum pump 35a; the second stage is composed of a small-bore tube 33b and an oil-sealed rotary vacuum pump 35b; and the third stage is composed of a small-bore tube 33c, a turbo-molecular pump 36 and an oil-sealed rotary vacuum pump 35c. This arrangement enables the differential evacuating means 30 to maintain the interior of the electron beam irradiation chamber 10 at atmospheric pressure and the interior of the electron beam generator 20 at a pressure of about $10^{-4}$ Pa. The turbomolecular pump 36 and the oil-sealed rotary vacuum pump 35c are mounted on the electron beam generator 20.

A line 37 for supplying an inert gas such as helium or nitrogen is provided as a purge gas feeding means on the communicating section 31 at a position adjacent to the electron beam irradiation chamber 10 (i.e., at a position on the first stage small-bore tube 33a closer to the electron beam irradiation chamber 10 side). Feeding purge gas from this tube makes the pressure in the vicinity of this position (that is, within the small-bore tube 33a and near the electron beam irradiation chamber 10) slightly higher than the pressure within the electron beam irradiation chamber 10.

An electron beam absorbing or reflecting means 14 such as a water-cooled metal plate is disposed within the electron beam irradiation chamber 10 so as to face across the filamentary workpiece 1 and toward the electron beam generator 20 (i.e., so as to be opposed to the direction of travel by electron beam 2 from the electron beam generator 20). Moreover, the electron beam irradiation chamber 10 is covered with an x-ray shielding means 15.

Although not shown in the diagrams, it is advantageous to provide a coil-like electron beam deflecting means for regulating the electron beam 2 so it passes through the center of the communicating section 3.

The apparatus shown in FIGS. 1 and 2 represents one embodiment of the inventive system, but is not restrictive of the invention. Other embodiments are possible with suitable modification within the scope of the claims.

By way of illustration, it is desirable to cover the electron beam irradiation chamber with an x-ray shielding means such as a lead or iron plate of suitable thickness to block x-rays so that bremsstrahlung harmful to the human body that are generated when the electron beam collides with matter do not leak outside of the system in a greater than permissible dose. Also, as already noted above, the electron beam irradiation chamber must have at least two openings of sufficient size for the filamentary workpiece to enter and leave the chamber. Because substantial leakage of x-rays to the exterior may occur if the openings are large, it is desirable to make the openings as small as possible without allowing contact with the filamentary workpiece to take place even if vibrations or other disturbances occur during travel of the workpiece. For example, when the filamentary workpiece is an optical fiber, circular openings having a diameter of about 1 to 10 mm are desirable. To improve ease of operation, the openings may even be diaphragms of variable aperture.

The electron beam generator has an electron generating means, an electron accelerating means, and an electron focusing means. The electron generating means may be any known electron source which utilizes such effects as thermionic emission, secondary emission, field emission or photoemission. Exemplary electron sources include hot cathodes (e.g., tungsten, lanthanum boride) and glow discharge cold cathodes. Hot cathodes have a simple and compact construction, but require the use of a high vacuum to prevent consumption. Cold cathodes have a complex construction, but can be used under a moderate vacuum and have a long life. The type of cathode used should be selected according to the intended purpose.

The electron accelerating means may be any known means for accelerating electrons using a direct-current field or radio-frequency field. For example, use may be made of either a direct-current field generated by applying a high direct-current voltage across parallel plate electrodes, or of an radio-frequency field created by applying a radio-frequency voltage to a cavity resonator. A direct-current field unit, including the power supply, has a simple and inexpensive construction, but requires a large amount of space to prevent discharges. On the other hand, a radio-frequency field unit, while not readily subject to discharges and capable of being built to small dimensions, normally requires as an accessory a bunching unit and is thus expensive and of complex construction. Accordingly, the choice of which type of electron accelerating means to use should be made based on the intended purpose.

The electron focusing means may be a known means such as an electrostatic lens or a magnetic lens. For example, use may be made of an electrostatic lens composed of three electrode plates, or a magnetic lens made of a permanent magnet or solenoid.

When the system includes a plurality of electron beam generators, disposing the generators at approximately equal intervals around the electron beam irradiation chamber is advantageous for achieving good uniformity of workpiece treatment. The phrase "at approximately equal intervals around," as used herein, means that the orthogonal projections, on a plane perpendicular to the filamentary workpiece, of the electron beams produced by the electron beam generators intersect the filamentary workpiece, and the angles formed between adjacent orthogonal projections are substantially the same for each of the projections. The distance from the intersection of the filamentary workpiece with the electron beam to the electron beam generator is preferably about the same for all the generators. For example, n electron beam generators (where $n \geq 2$) can be arranged so as to fall on a circle which is situated in a plane perpendicular to the filamentary workpiece and centered on the workpiece at intervals of 360/n degrees so that the electron beams intersect the filamentary workpiece. Alternatively, instead of being arranged in a plane perpendicular to the filamentary workpiece, the electron beam generators can be arranged so as to fall on the surface of a circular cone centered on the workpiece. Another possibility is to have the generators arranged alternately on different surfaces. The number of electron beam generators, which is selected based in part on the diameter of the electron beam and the diameter of the filamentary workpiece, can be set at two or more. When the filamentary workpiece is an optical fiber, the number of generators is preferably from 2 to 6. In addition, it is also possible for the system to have two or more electron beam generator stages in an overlapping arrangement, where each stage is made up of a plurality of electron beam generators disposed in the manner described above.

The electron beam generator and the electron beam irradiation chamber are connected by a differential evacuating means of at least one stage, and the generator is held to a lower pressure than the irradiation chamber. Any ordinary differential evacuating means known to the art may be used. Typical examples of suitable means of this type include combinations of a small-bore tube or orifice with a vacuum pump. In such a case, letting C be the conductance of the small-bore tube or orifice, S be the pump-down speed of the vacuum pump, and Pi and Po be respectively the pressure at the inlet and outlet of the small-bore tube or orifice, for Pi>>Po, the relationship $$Po/Pi=C/S$$

generally holds and a pressure differential can be achieved between the small-bore tube or orifice inlet and outlet. If the capacity of the pump does not allow the desired pressure differential to be attained in a single stage, a large pressure differential can be arrived at by connecting a plurality of stages in series. For example, to connect a high-vacuum ($10^{-4}$ Pa) electron beam generator with a low-vacuum ($10^2$ Pa) electron beam irradiation chamber, the use of a two-stage differential evacuating means is preferred. One advantageous way for doing so involves interconnecting the electron beam irradiation chamber and the electron beam generator using two small-bore tubes, evacuating the interconnecting sections with an oil-sealed rotary vacuum pump, and evacuating the electron beam generator with a turbomolecular pump. The connection of a high-vacuum ($10^{-4}$ Pa) electron beam generator with an atmospheric pressure ($10^5$ Pa) electron beam irradiation chamber is preferably carried out using a three- or four-stage differential evacuating means. For example, the use of a three-stage differential evacuating means typically involves interconnecting the electron beam irradiation chamber with the electron beam generator using three small-bore tubes, evacuating two of the interconnecting sections with, from the low-vacuum side, a mechanical booster pump and an oil-sealed rotary vacuum pump, and evacuating the electron beam generator with a turbomolecular pump.

Typically, a workpiece moving means which feeds the filamentary workpiece to the electron beam system and later winds up the workpiece into a roll is separately provided outside of the system. Under the operation of such a workpiece moving means, the workpiece is continuously fed through the inlet opening in the electron beam irradiation chamber, passes through the interior of the chamber, then exits from a separate outlet opening and is taken up into a roll. The electrons generated by the electron generating means are accelerated to a given energy by the electron accelerating means, and focused to a given beam size by an electron focusing means. The beam of focused electrons then passes through the interior of the communicating section (e.g., small-bore tube or orifice) which connects the electron beam generator with the electron beam irradiation chamber, and thus irradiates the filamentary workpiece without passing through a solid. A single electron beam generator may have a plurality of electron accelerating means and electron focusing means which may be arranged in any suitable order.

It is desirable to provide a purge gas feeding means at a position within the communicating section which is near the electron beam irradiation chamber, so as to set the pressure within the communicating section in the vicinity of such a purge gas feeding means to a slightly higher pressure than the interior of the electron beam irradiation chamber (typically, a pressure about 1.1 to 1.5 times, and especially 1.1 to 1.3 times, the pressure within the electron beam irradiation chamber). The purge gas feeding means may be comprised of, for example, a purge gas line that opens into the communicating section and a flow-regulating valve. The purge gas is preferably the same as the inert gas in the electron beam irradiation chamber.

The pressure within the electron beam irradiation chamber may be lower than atmospheric pressure or approximately atmospheric pressure. A pressure below atmospheric pressure minimizes scattering of the electron beam, resulting in a high irradiation efficiency. On the other hand, it discourages the use of components which vaporize at pressures lower than atmospheric pressure, such as electron beam-curable resins. When the pressure within the irradiation chamber is set at atmospheric pressure, the electron beam is scattered somewhat by the ambient gas, resulting in a lower irradiation efficiency than at pressures below atmospheric pressure. However, setting the irradiation chamber at atmospheric pressure allows volatile component-containing materials such as electron beam-curable resins to be used. Accordingly, the pressure within the electron beam irradiation chamber should be selected as appropriate for the intended purpose. If a pressure lower than atmospheric pressure is employed, the level of that pressure will vary empirically according to such factors as the type of object to be treated, but can generally be set within a range of about 0.1 to $10^4$ Pa, and especially 1 to $10^3$ Pa. To set the pressure within the electron beam irradiation chamber below atmospheric pressure, a differential evacuating means for holding the pressure within the chamber below atmospheric pressure must be provided at an opening through which the filamentary workpiece passes. Any common differential evacuating means known to the prior art may be used for this purpose. Such a means may be composed of, for example, an elongated tube having a sufficiently large inside diameter for the filamentary workpiece to pass through it, and a vacuum pump. When the filamentary workpiece is an optical fiber and the elongated tube has an inside diameter of less than about 1 mm, the fiber may come into contact with the tube. To avoid this possibility, it is preferable for the tube to have an inside diameter bore of at least about 1 mm. The vacuum pump used for this purpose may be a low-vacuum, large-displacement pump, such as a mechanical booster pump. If necessary, a plurality of such differential evacuating means may be connected and used together. In addition, it is advantageous to provide a purge gas feeding means near the opening on the atmospheric side of the elongated tube and thereby feed a purge gas so that the pressure inside the tube near the atmospheric side opening is slightly higher than atmospheric pressure. The purge gas feeding means preferably includes a purge gas line that opens into the elongated tube, and a flow rate-regulating valve. The purge gas is preferably air or nitrogen.

When the electron beam irradiation chamber is at approximately atmospheric pressure, the atmosphere within the irradiation chamber is preferably an inert gas (e.g., nitrogen or helium) that is chemically inert in the plasma state. A helium atmosphere is especially preferred because the level of electron beam scattering is low. Moreover, it is desirable for the distance between the electron beam inlet (indicated in FIGS. 1 and 2 by reference numeral 16) to the electron beam irradiation chamber and the filamentary workpiece to be less than about 20 mm in a nitrogen atmosphere and less than about 60 mm in a helium atmosphere. Distances larger than these in the respective cases may result in greater scattering of the electron beam by the ambient gas, and thus lower irradiation efficiency.

Preferably, an electron beam absorbing means for absorbing those electron beams emitted by the electron beam generator which have not impinged on the filamentary workpiece and recovering that energy as heat is provided at a position facing across the filamentary workpiece and toward the electron beam generator. The electron beam absorbing means may be, for example, a metal plate cooled on the interior with water. By using a metal with a high atomic number such as gold in the metal plate, a portion of the electron beams which have not impinged on the filamentary workpiece can be reflected and reused, thereby having the desirable effect of increasing the radiation efficiency. In system configurations in which electron beam generators are situated directly across from one another, an electron beam absorbing means having a small hole through which the electron beam passes may be installed on the electron beam inlet side of the electron beam irradiation chamber. The electron beam irradiation intensity can be adjusted by varying the current of the electron beam. Such adjustment is preferably coupled to the traveling speed of the filamentary workpiece.

The electron beam system according to the invention may include also other mechanisms, such an electron beam deflecting means capable of freely changing the direction of the electron beam, an electron beam intensity distribution measuring means for detecting the position of electron beam irradiation, and a filamentary workpiece position-measuring means for measuring the position of the workpiece. The electron beam deflecting means may be one known to the art, such as a deflection coil magnetic field or a parallel plate electrode electric field. Alternatively, use may be made of a control mechanism which combines both and automatically trains the center of the electron beam on the filamentary workpiece.

The present invention is particularly suitable for use in cases where the filamentary workpiece is an optical fiber coated with a liquid composition of an electron beam-curable resin. The accelerated electrons in such cases preferably have a maximum energy of up to about 120 keV, and an average energy of at least about 60 keV. At a maximum accelerated electron energy greater than about 120 keV, transmission loss in the optical fibers may increase. An average accelerated electron energy of less than about 60 keV may lead to insufficient curing of deep areas in the resin.

The method of fabricating optical fiber according to the second aspect of the invention includes applying a liquid composition of an electron beam-curable resin coating material to an optical fiber, then using the electron beam system according to the first aspect of the present invention to irradiate the applied composition with an electron beam in which the accelerated electrons have a maximum energy of up to about 120 keV and an average energy of at least about 60 keV so as to cure the coating. Any known electron beam-curable resin coating material may be used, such as one composed primarily of urethane acrylate. Coating of the liquid composition of an electron beam-curable resin coating material onto the optical fiber may be carried out by a known technique, such as die coating. When an electron beam-curable resin coating material composed primarily of urethane acrylate is used, irradiation such as to give an absorbed dose of about 10 to about 100 kGy is preferred. At an absorbed dose of less than about 10 kGy, curing of the resin may be insufficient, whereas a dose greater than about 100 kGy may lead to electron beam-induced deterioration of the resin. The oxygen concentration within the irradiation atmosphere is preferably not more than about 1,000 ppm, and most preferably within a range of 10 to 500 ppm. An oxygen concentration greater than about 1,000 ppm may result in poor curing of the surface.

Optical fiber tape may similarly be fabricated using the electron beam system according to the invention. In this case, electron beam irradiation is preferably carried out such that the accelerated electrons have a maximum energy of less than about 160 keV, and an average energy of at least about 120 keV.

In working the invention, it is possible to combine a plurality of electron beam generators as a single unit or to divide the electron beam generated from a single electron beam generator into a plurality of electron beams, so long as the objects and advantages of the invention are attainable.

In the invention, the electron beam irradiation chamber which is under a low vacuum or at atmospheric pressure because it opens to the exterior, and the electron beam generator which is under a high vacuum for the sake of electron acceleration are connected by a differential evacuating means in a communicating section. Because the electron beam passes through the communicating section between the electron beam generator and the electron beam irradiation chamber and irradiates the filamentary workpiece, unlike in prior-art systems, the electron beam is not scattered as it passes through a window (metal foil), thereby making it possible to achieve highly efficient irradiation. Also, when the electron beam generators are arranged at approximately equal intervals around the electron beam irradiation chamber, uniform electron beam irradiation about the circumference of the filamentary workpiece can be achieved. Moreover, because the filamentary workpiece passes through openings in the electron beam irradiation chamber which are provided with x-ray shielding means, and thereby can be made to continuously pass through the interior of the chamber, it is possible both to block out bremsstrahlung which are harmful to the human body and also to carry out continuous electron beam irradiation of the filamentary workpiece.

In addition, in the inventive system, a purge gas may be fed at a position within the communicating section close to the electron beam irradiation chamber so as to make the pressure within the communicating section slightly higher than the pressure within the electron beam irradiation chamber. This prevents foreign matter outside the system from being drawn in and obstructing the communicating section, thus making it possible to stably carry out differential evacuation and electron beam irradiation. In cases where irradiation is carried out at atmospheric pressure, scattering of the electron beam by the gas can be minimized by carrying out irradiation in a helium atmosphere.

The depth to which an electron beam penetrates matter depends on the energy of the accelerated electrons. When the filamentary workpiece is an optical fiber that has been coated with a liquid composition of an electron beam-curable resin, by setting the maximum energy of the accelerated electrons to not more than about 120 keV and the average energy to at least about 60 keV, the electron beam penetrates to the deep areas of the resin but does not reach the core of the optical fiber. This makes it possible to fully cure the resin without an accompanying transmission loss in the optical fiber.

EXAMPLES

Optical fibers coated with an electron beam-curable resin were treated using the electron beam system shown in FIGS.

1 and 2. In this system, the electron beam irradiation chamber 10 is covered with x-ray shielding means 15 made of lead plates. The interior of the electron beam irradiation chamber 10 is filled with atmospheric pressure helium via a helium line 13 for introducing the ambient gas. The filamentary workpiece 1 enters through an opening 11 in the electron beam irradiation chamber 10, and travels through the center of the electron beam irradiation chamber 10. Three electron beam generators 20 are arranged at mutual angles of about 120° C. around the electron beam irradiation chamber 10, and each is connected with the electron beam irradiation chamber 10 via the communicating section 31 of a differential evacuating means 30. Each differential evacuating means 30 is made up of three stages: a first stage having a small-bore tube 33a, a mechanical booster pump 34 and an oil-sealed rotary vacuum pump 35a; a second stage having a small-bore tube 33b and an oil-sealed rotary vacuum pump 35b; and a third stage having a small-bore tube 33c, a turbomolecular pump 36 and an oil-sealed rotary vacuum pump 35c. By means of this arrangement, the pressure within the electron beam generators 20 is held to about $10^{-4}$ Pa. A purge helium line 37 is connected to the small-bore tube 33a opening into the electron beam irradiation chamber 10 at a point close to the irradiation chamber, and helium gas is supplied so as to make the pressure within the small-bore tube 33a near the electron beam irradiation chamber slightly higher than the pressure within the irradiation chamber. The electron beam generator 20 includes a tungsten filament 21 as the electron generating means, parallel plate electrodes 22 as the electron accelerating means, and a solenoid 23 as the electron focusing means. Thermions generated by passing a current through the tungsten filament 21 and heating it are accelerated through an electrical field generated by applying a high direct-current voltage of about 60 to 120 kV across the parallel plate electrodes 22. The accelerated electrons are then focused into an electron beam 2 under the influence of a magnetic field generated by passing a direct current through the solenoid 23. The electron beam 2 passes through the small-bore tubes 33c, 33b and 33a (communicating section 31) of differential evacuating means 30 and irradiates the filamentary workpiece 1. Superfluous electron beams that do not strike the filamentary workpiece 1 are absorbed by an electron beam absorbing means 14 made up of a water-cooled metal plate. Although not shown in the diagrams, a coil-type electron beam deflecting means is provided to regulate the electron beam 2 so it passes through the centers of the small-bore tubes.

A bare single-mode optical fiber (diameter, 125 μm; transmission loss at a wavelength of 1.55 μm, 0.188 dB/km) traveling at 1,000 m/min was coated with a liquid composition of an electron beam-curable coating material having a low Young's modulus and composed primarily of urethane acrylate by means of a coating die such as to bring the outside diameter of the coated optical fiber to 200 μm. In addition, this uncured coated optical fiber was coated with a liquid composition of a high Young's modulus electron beam-curable coating material composed primarily of urethane acrylate by means of a coating die such as to bring the outside diameter of the coated optical fiber to 250 μm. The coated optical fiber was then cured in the above-described electron beam system by irradiating the optical fiber from three directions with electron beams accelerated at an acceleration voltage of 80 kV, so as to give an absorbed dose of 50 kGy in each direction. The distance from the inlet where the electron beam enters the irradiation chamber to the optical fiber was set at 20 mm, and irradiation was carried out in a helium atmosphere having an oxygen concentration of 100 ppm. The transmission loss of this optical fiber at a wavelength of 1.55 μm was 0.189 dB/km. The ratio of transmission loss following electron beam irradiation to that before irradiation was 1.005, indicating the absence of substantially any increase in transmission loss from electron beam irradiation. The gel fraction of the resin coat was about 95%, which demonstrated that sufficient curing had taken place.

Unlike conventional electron beam systems, the electron beam system according to the invention is able to uniformly, efficiently, and continuously apply electron beam irradiation to a traveling filamentary workpiece. When used for manufacturing optical fiber, the inventive system is able to accommodate higher fiber drawing speeds without compromising the transmission characteristics of the finished optical fiber.

Japanese Patent Application No. 2000-220503 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. An electron beam system for treating a filamentary workpiece, the system comprising:
    an electron beam irradiation chamber having a plurality of openings through which passes a filamentary workpiece,
    an electron beam generator having an electron generating means, an electron accelerating means and an electron focusing means;
    a communicating section which connects the electron beam generator with the electron beam irradiation chamber, and
    differential evacuating means of at least one stage for holding the pressure within the electron beam generator below that within the electron beam irradiation chamber;
    wherein electrons are generated by the electron generating means, accelerated by the electron accelerating means, and focused by the electron focusing means into a beam, which passes from the electron beam generator through the communicating section to the electron beam irradiation chamber where the beam is directed at a filamentary workpiece that passes continuously through the openings in the chamber, wherein a plurality of electron beam generators are arranged at approximately equal intervals around the electron beam irradiation chamber; wherein the atmosphere of the electron beam irradiation chamber is helium; wherein the pressure within the electron beam irradiation chamber is about atmospheric pressure; and wherein the distance from the inlet where the electron beam enters the irradiation chamber to the filamentary workpiece is less than about 60 mm.

2. The electron beam system of claim 1 which has a purge gas feeding means which is situated on the communicating section at a position adjacent to the electron beam irradiation chamber and feeds purge gas so as to make the pressure within the communicating section in the vicinity of said means higher than the pressure within the electron beam irradiation chamber.

3. The electron beam system of claim 1, wherein the pressure within the electron beam irradiation chamber is kept below atmospheric pressure by another differential evacuating means mounted at an opening through which the filamentary workpiece passes.

4. The electron beam system of claim 1, wherein the distance from the electron beam inlet to the filamentary workpiece in the irradiation chamber is less than about 20 mm.

5. The electron beam system of claim 1 in which a means for reflecting or absorbing the electron beam is disposed in the electron beam irradiation chamber such as to face across the filamentary workpiece and toward the electron beam generator.

6. The electron beam system of claim 1, wherein the filamentary workpiece is an optical fiber coated with a liquid composition of an electron beam-curable resin.

7. The electron beam system of claim 6, wherein the accelerated electrons have a maximum energy of up to about 120 keV and an average energy of at least about 60 keV.

8. The electron beam system of claim 1, wherein the filamentary workpiece is a bundle of optical fibers that is coated with a liquid composition of an electron beam-curable resin.

9. The electron beam system of claim 8, wherein the accelerated electrons have a maximum energy of up to about 160 keV and an average energy of at least about 120 keV.

* * * * *